United States Patent
Gabriel et al.

(10) Patent No.: US 6,846,749 B1
(45) Date of Patent: Jan. 25, 2005

(54) N-CONTAINING PLASMA ETCH PROCESS WITH REDUCED RESIST POISONING

(75) Inventors: Calvin T. Gabriel, Cupertino, CA (US); Lynne A. Okada, Sunnyvale, CA (US); Ramkumar Subramanian, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 192 days.

(21) Appl. No.: 09/887,165

(22) Filed: Jun. 25, 2001

(51) Int. Cl.⁷ .............................................. H01L 21/302
(52) U.S. Cl. .................. 438/714; 438/638; 438/683; 438/687; 438/725; 438/740; 430/5
(58) Field of Search ............................. 430/5; 438/725, 438/714, 687, 624, 618, 637, 638, 639, 640, 694, 740, 723, 724

(56) References Cited

U.S. PATENT DOCUMENTS

| | | |
|---|---|---|
| 4,804,636 A | 2/1989 | Grover, III et al. ........... 437/52 |
| 5,176,790 A | 1/1993 | Arleo et al. ................. 156/643 |
| 5,908,319 A | 6/1999 | Xu et al. .................... 438/725 |
| 5,935,877 A | 8/1999 | Autryve ...................... 438/743 |
| 6,025,116 A | 2/2000 | Grassmann .................. 430/313 |
| 6,103,456 A | 8/2000 | Többen et al. .............. 430/317 |
| 6,130,166 A | 10/2000 | Yeh ............................ 438/710 |
| 6,268,294 B1 * | 7/2001 | Jang et al. .................. 438/706 |
| 6,316,351 B1 * | 11/2001 | Chen et al. ................. 438/638 |
| 6,380,084 B1 * | 4/2002 | Lim et al. ................... 438/687 |
| 2002/0123226 A1 * | 9/2002 | Trapp ......................... 438/698 |

* cited by examiner

Primary Examiner—George A. Goudreau

(57) ABSTRACT

A method for forming a metal interconnect comprises exposing a dielectric layer to an etch chemistry containing nitrogen-containing compound such as $NH_3$, $NF_3$ or $N_2O$. The nitrogen-containing compound provides selectivity and/or profile control comparable to that provided by $N_2$, while avoiding poisoning of photoresist by embedded $N_2$.

10 Claims, 2 Drawing Sheets

US 6,846,749 B1

N-CONTAINING PLASMA ETCH PROCESS WITH REDUCED RESIST POISONING

CROSS REFERENCE TO RELATED APPLICATIONS

This application is related to Ser. No. 09/887,166, filed Jun. 25, 2001, and to Ser. No. 09/887,084, filed Jun. 25, 2001, and to Ser. No. 09/886,989, filed Jun. 25, 2001.

FIELD OF THE INVENTION

The present invention relates to photolithographic etching of a substrate, and in particular to a method for preventing poisoning of a photoresist during semiconductor fabrication.

BACKGROUND OF THE INVENTION

Photolithographic techniques are commonly used in the fabrication of integrated circuits. Photolithography entails coating a surface of a substrate that is to be etched with a photoresist, which is then selectively exposed to electromagnetic radiation, for example using a reticle to define a selective exposure pattern on the photoresist, and developed to define a pattern in the photoresist, which is then used as an etch mask. The patterned photoresist material is removed from the substrate after it has been used as an etch mask.

Photoresists are classified according to their response to electromagnetic radiation. Positive photoresists are applied to substrate surfaces as polymers, selected portions of which depolymerize when exposed to electromagnetic radiation, for instance using a reticle to define the selective exposure pattern. The depolymerized portions are then removed from the substrate surface by a developing treatment, such as by exposure to a developing solvent that selectively dissolves depolymerized photoresist. The pattern formed by the photoresist matches the reticle pattern. Negative photoresists are applied as monomers or low molecular weight polymers, which polymerize or cross-link upon exposure to electromagnetic radiation. In the case of a negative photoresist, the unexposed portions of the selectively exposed photoresist are removed during development. The pattern formed by exposure and development is the negative image of the reticle. Hence the designation as a negative photoresist. Photoresists that selectively react (i.e. depolymerize, polymerize or cross-link) when exposed to DUV (i.e. ultraviolet light having a wavelength of less than about 300 nm) are referred to as DUV photoresists.

Photolithographic techniques are applicable to selective etching of many different materials. For instance, etching of a dielectric is commonly achieved by dry etching of a dielectric using a patterned photoresist as an etch mask. Dry etching methods include plasma etching (PE) and reactive ion etching (RIE). In both plasma etching and RIE there is the potential chemicals in the etch chemistry to poison later-deposited photoresists. It is common to use $N_2$ in dry etching to provide selectivity control and profile control. The amount of $N_2$ is adjusted in relation to the etchant to provide optimal control of selectivity and profile characteristics. However, in such etching processes, $N_2$ may become embedded in dielectric layers. Such $N_2$ may then diffuse into a later-deposited photoresist layer, where it can interfere with the photochemistry of the photoresist. Thus, $N_2$ introduced during etching can poison photoresist layers, and thereby interfere with later processing steps.

Modern integrated circuit fabrication commonly requires two or more photolithographic steps. For instance, in a so-called dual damascene process, two photolithographic steps are used to define a hole (via) and a trench. A first photolithographic step is carried out to form a hole or via through a dielectric layer, such as an $SiO_2$ or an SiON layer, to a conductive layer beneath the dielectric layer. A second photolithographic step is then carried out to form a trench connecting to the via. In such a process, a first photoresist is applied to the surface of a dielectric layer, and the photoresist is then selectively exposed and developed to form a via pattern. The via is then formed by selectively etching through the dielectric to the underlying conductive layer by, for instance, anisotropic dry etching or reactive ion etching (RIE) in a vertical direction. Once the via is formed, the first photoresist layer is removed, typically by one or more ash steps. A second photoresist layer is then applied, exposed, and developed to form a trench pattern. This is followed by a second etch step, using the second photoresist as a mask. The second photoresist layer is then removed, the via and trench are filled with a conductive material, such as a metal or a silicide, and then the conductive material is planarized back to the level of the dielectric surface.

In the dual damascene process described above, it is essential to remove all exposed photoresist (in the case of a positive photoresist) or unexposed photoresist (in the case of a negative photoresist) during the developing step of each stage of photolithographic processing, because residual photoresist acts as an etch mask. Contaminants in the dielectric may poison photoresists, resulting in defective etching of the substrate. While typical clean room conditions generally ensure that the first photoresist layer will experience little interference from exogenous chemical contaminants, second and subsequent photoresist layers may be contaminated by a number of chemical contaminants (photoresist poisons), such as $N_2$ embedded in the substrate to be etched. Photoresist poisons tend to block the electromagnetic radiation-induced reaction (depolymerization, polymerization or crosslinking) in the selectively exposed photoresist, resulting in incomplete developing of the photoresist pattern.

To illustrate the problem, a typical prior art process for forming a via and trench combination is depicted in FIGS. 1A–1H. The prior art process is illustrated for the case where the photoresist layers are both positive photoresists, however the skilled artisan will recognize that this is merely illustrative and that the same principles apply to negative photoresists.

A precursor 10 comprising a conductive layer 12 and a dielectric layer 14 is depicted in FIG. 1A. A person skilled in the art will recognize that the precursor 10 can include other features that are not shown because they are not essential to understanding the prior art process. Such other features include, for instance, MOS devices, resistors, capacitors, etc. The conductive layer 12 may be, for instance, aluminum, copper, metal silicide, or other suitable conductor. The dielectric layer 14 may include, for instance, $SiO_2$ or a low K dielectric material.

As depicted in FIG. 1B, a first photoresist layer 16, is applied over the dielectric layer 14 by an art recognized method, such as by a spin-on technique. The photoresist layer 16 is then selectively exposed and developed to form a patterned photoresist layer 16, as depicted in FIG. 1C. Next, the portion of dielectric layer 14 that is exposed through the first photoresist layer 16 is etched, for instance by anisotropic dry etching in the vertical direction, to partially expose conductive layer 12, as depicted in FIG. 1D. Photoresist poison 18 is embedded in the dielectric layer 14 during the etching process. The source of photoresist poison 18 in this regard is $N_2$ that has been added to the etch chemistry to control profile and selectivity.

Then, the photoresist layer is removed by, for instance, a plasma ash, thereby producing the etched dielectric 14 depicted in FIG. 1E. The article 10 comprises conductive layer 12 and etched dielectric layer 14.

FIG. 1F shows the precursor 10 after a second photoresist layer 20 has been deposited. Nitrogen ($N_2$) 22 in photoresist poison 18 diffuses into the second photoresist layer 20. The $N_2$ 22 interferes with the photochemistry of the second photoresist layer 20 during selective exposure, preventing depolymerization of the second photoresist 20.

FIG. 1G shows precursor 10 after selective exposure of the second photoresist 20. Residual poisoned photoresist 24 is the result of incomplete depolymerization of the photoresist 20. This poisoned photoresist 24 is not removed during developing, and as a result masks portions of dielectric 14 that are intended to be etched during trench formation.

FIG. 1H shows the precursor 10 after a trench etch step. The poisoned photoresist 24 has masked portions of dielectric layer 18, resulting in humps 26. These humps 26 are device defects that may result in incomplete, or no, contact between via and trench conductor materials. Such defects introduced during the photolithographic processing of integrated circuits lead to decreased device speed, or in some cases inoperability of the integrated circuit.

There is therefore a need for a photolithographic process that reduces defects caused by poisoning of photoresists by residual $N_2$ introduced during a dielectric etch step.

There is also a need for a photolithographic process that provides an etch step having an etch chemistry that provides selectivity and profile control comparable to that provided by $N_2$, but that prevents, avoids or ameliorates photoresist poisoning caused by $N_2$ in the etch chemistry.

SUMMARY OF THE INVENTION

These and other needs are met by the present invention, which provides a method of etching a dielectric layer, comprising the steps of: providing an article having a dielectric layer thereon; depositing a photoresist on the dielectric layer; patterning the photoresist; and exposing the dielectric to an etch chemistry comprising an etchant and one or more member selected from $NH_3$, $NF_3$ and $N_2O$ in an amount sufficient to control selectivity, profile, or both.

These and other needs are further met by the present invention, which provides a method of forming an interconnect structure having a first feature and a second feature, comprising the steps of: providing an article comprising a conductive layer that has a dielectric layer thereon; depositing a first photoresist layer on the dielectric layer; patterning the first photoresist layer to form a first mask pattern defining the first feature; etching the dielectric layer using the first photoresist layer as a mask to form the first feature using an etch chemistry that comprises a member of the group $NH_3$, $NF_3$ and $N_2O$; removing the first photoresist; depositing a second photoresist layer on the article; patterning the second photoresist layer to form a second mask pattern defining the second feature; etching the dielectric layer using the second photoresist layer as a mask to form the second feature.

These and other needs are further met by the present invention, which provides a dual damascene method of forming an interconnect structure having a via and a trench, comprising the steps of: providing a semiconductor wafer comprising a conductive layer that has a dielectric layer thereon; depositing a first photoresist layer on the dielectric layer; patterning the first photoresist layer to form a first mask pattern defining the via; etching the dielectric layer using the first photoresist layer as a mask to form the via using an etch chemistry that comprises a member of the group $NH_3$, $NF_3$ and $N_2O$; removing the first photoresist; depositing a second photoresist layer on the article; patterning the second photoresist layer to form a second mask pattern defining trench; etching the dielectric layer using the second photoresist layer as a mask to form the trench; depositing copper or a copper alloy in the trench and via; and etching the copper or copper alloy back to the surface of the dielectric layer.

The foregoing and other features, aspects and advantages of the present invention will become more apparent from the following detailed description of the present invention, when taken in conjunction with the accompanying drawings.

DETAILED DESCRIPTION OF THE INVENTION

Figure 1A:
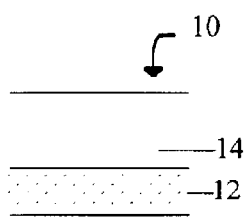
FIGS. 1A–1H depict a prior art photolithography process, in which photoresist poison prevents removal of a portion of exposed photoresist.
Figure 1B:
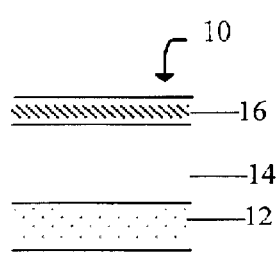
Figure 1C:
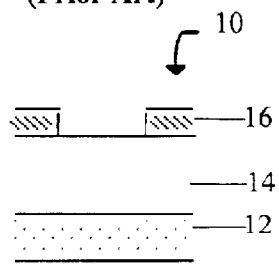
Figure 1D:
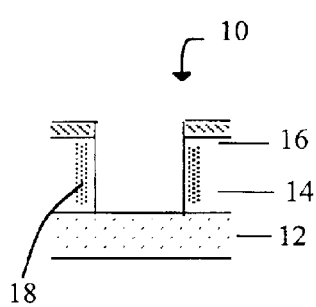

The present invention relates to an improved process for etching a substrate, wherein deposition of $N_2$, and concomitant photoresist poisoning thereby is prevented by employing a non-$N_2$, nitrogen-containing compound in the dielectric etch chemistry. In particular, the present invention employs one or more non-$N_2$, nitrogen-containing compounds such $NH_3$, $NF_3$ or $N_2O$ in place of $N_2$. The non-$N_2$, nitrogen-containing compounds offer etch benefits similar to those provided by $N_2$, while reducing or eliminating photoresist poisoning associated with $N_2$. The process according to the present invention alleviates the problem of nitrogen poisoning of photoresists and therefore provides for more precise etching of semiconductor features, such as vias and trenches.

While not wishing to be bound by any theory, the present inventors believe that inclusion of a non-$N_2$, nitrogen-containing compound in the plasma etch chemistry prevents deposition or embedding of nitrogen-containing chemical species in the dielectric, because non-$N_2$, nitrogen containing compounds such as $NH_3$, $NF_3$ and $N_2O$ do not become embedded in the dielectric material. Thus, the non-$N_2$, nitrogen-containing compounds according to the present invention are not available to leach into, and poison, subsequently employed photoresist material. Thus, $N_2$ poisoning of photoresists is prevented by employing non-$N_2$, nitrogen containing compounds such as $NH_3$, $NF_3$ or $N_2O$ in the dielectric etch chemistry in accordance with the present invention.

Particular reference is made below to a process according to the present invention that is used as part of a method of forming a via and a trench in a dielectric layer. However, the skilled artisan will recognize that the dielectric etch method according to the present invention may be used in a variety of situations in which it is desirable to etch a dielectric, and where it is undesirable for $N_2$ to become embedded in the dielectric surface.

The dielectric etch method according to the present invention advantageously comprises one or more steps in which a chemical species is brought into contact with the article to selectively etch exposed portions of the article, using a patterned photoresist as an etch mask. In some embodiments according to the present invention, the etch method comprises a radio frequency (RF) plasma etch, wherein the plasma chemistry comprises one or more of $NH_3$, $NF_3$ or $N_2O$ as agents for affecting profile or selectivity control. In other embodiments according to the present invention, the etch method comprises a reactive ion etch (RIE) ash step, wherein the RIE chemistry comprises one or more of $NH_3$, $NF_3$ or $N_2O$ as agents for affecting profile or selectivity control. In still further embodiments according to the present invention, the etch method comprises both a RIE etch step and a RF etch step.

The method according to the present invention may be more fully understood with reference to FIGS. 2A–2H, as described below.

Figure 2A:
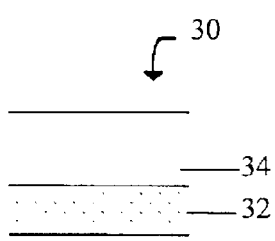
FIGS. 2A–2H depict a photolithography process including an etch step comprising a non-$N_2$ nitrogen-containing compound according to the present invention.

As depicted in FIG. 2A, an article 30 having a metal interconnect structure is provided, which comprises conductive layer 32 and dielectric layer 34. Dielectric layer 34 is located over conductive layer 32. In particular embodiments according to the present invention, dielectric layer 34 is adjacent conductive layer 32. In other embodiments according to the present invention, an anti-reflective coating (not shown) may be sandwiched between dielectric layer 34 and conductive layer 32. While not shown, it is to be understood that article 30 advantageously further comprises semiconductor devices such as NMOS, PMOS and CMOS devices, as well as resistors, capacitors, and other components known to the person skilled in VLSI and ULSI fabrication technology.

The conductive layer 32 advantageously comprises a conventional conductive material, such as a metal or a metal silicide. Exemplary conductive metals include aluminum, an aluminum alloy, platinum, silver and copper, while exemplary conductive metal silicides include cobalt silicide, titanium silicide and nickel silicide. Other conductive materials are advantageously employed in the method according to the present invention. The conductive layer 32 is advantageously formed by an art recognized method, such as conformal deposition, sputtering or CVD, followed by planarization, in the case where the conductive layer is a metal, or by a suitable silicidation method, in the case where the conductive layer 32 comprises a metal silicide.

In some embodiments according to the present invention, the dielectric layer 34 is a layer of dielectric material, such as $SiO_2$. In particular embodiments according to the present invention, the dielectric layer 34 is a $SiO_2$ layer that is deposited by TEOS on the conductive layer 32. In other embodiments, the dielectric layer 34 is a low K dielectric layer.

Figure 2B:
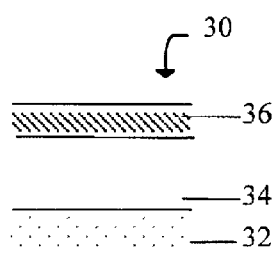

A first photoresist layer 36 is deposited on the dielectric layer 34 as depicted in FIG. 2B. The first photoresist layer 36 advantageously comprises a conventional photoresist compound, such as a positive DUV photoresist. The photoresist layer 36 is advantageously applied to the dielectric layer 34 directly by an art-recognized method, such as a spin-on method. In other embodiments according to the present invention, an intermediate layer (not shown) is applied to the dielectric layer 34, after which the dielectric layer 34 is applied to the intermediate layer (not shown), such that the intermediate layer (not shown) is sandwiched between the dielectric layer 34 and the photoresist layer 36. This intermediate layer (not shown) advantageously includes an anti-reflective coating, which absorbs and dissipates the photon energy that passes through the photoresist, thereby preventing the formation of standing waves in the exposed photoresist.

Figure 2C:
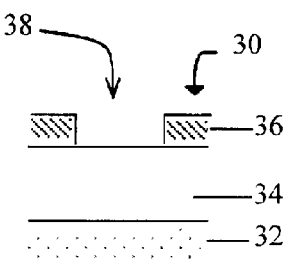

The photoresist layer 36 is then patterned as depicted in FIG. 2C. The photoresist layer 36 is patterned by selectively exposing the photoresist layer 36 to electromagnetic radiation, such as DUV light, and then developing the photoresist layer 36 by removing the selectively exposed photoresist. The selectively exposed (positive) photoresist is advantageously removed by an art-recognized method, such as RF plasma etch, RIE, or wet chemical dissolution. After developing, the photoresist layer 36 includes aperture 38.

Figure 2D:
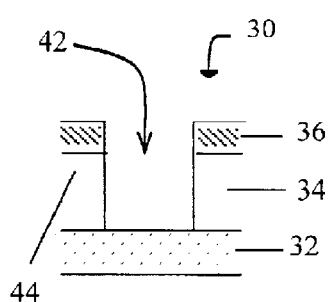

The dielectric layer 34 is then selectively etched as depicted in FIG. 2D. The dielectric layer 34 is selectively etched by subjecting article 30 to an etch, such as an anisotropic dry etch, that is selective for the dielectric. The photoresist layer 36 acts as an etch mask, while dielectric 34 is etched by an etchant, such as a fluorocarbon, a hydrofluorocarbon, a chlorocarbon, or a fluorochlorocarbon, through aperture 38. The unmasked portions of dielectric layer 34 are thus selectively etched back to the surface of conductive layer 32 to produce via 42.

The etch chemistry further contains one or more non-$N_2$, nitrogen-containing compound selected from $NH_3$, $NF_3$ and $N_2O$. The non-$N_2$, nitrogen containing compound selected from $NH_3$, $NF_3$ and $N_2O$ provides profile and/or selectivity control similar to that provided by $N_2$, while at the same time avoiding the deposition of $N_2$ in the dielectric layer. As discussed above, the etch chemistry comprises an etchant, such as a conventional dry etchant, and a non-$N_2$, nitrogen-containing compound selected from $NH_3$, $NF_3$ and $N_2O$. In some embodiments according to the present invention, the etch chemistry also comprises one or more inert gases such as He, Ne or Ar.

The etch method according to the present invention uses an etch chemistry that is selective for a particular substrate, such as a dielectric. In addition to the non-$N_2$, nitrogen-containing compounds taught above, the etch chemistry comprises one or more etchants such as a hydrochlorocarbon, a fluorocarbon, a hydrofluorocarbon, a chlorofluorocarbon, etc. In some embodiments according to the present invention, the etchant comprises $HCF_3$.

In some embodiments according to the present invention, the etch chemistry comprises only one non-$N_2$, nitrogen-containing compound selected from $NH_3$, $NF_3$ and $N_2O$. In other embodiments according to the present invention, the etch chemistry comprises two members selected from $NH_3$, $NF_3$ and $N_2O$. In still further embodiments according to the present invention, the etch chemistry comprises all three of $NH_3$, $NF_3$ and $N_2O$.

In some embodiments according to the present invention, the etch chemistry also comprises one or more inert carrier gas, such as helium (He), neon (Ne), or argon (Ar).

In embodiments according to the present invention where the etch chemistry includes more than one member selected from $NH_3$, $NF_3$ and $N_2O$, the mole ratio of one member to another is advantageously selected to maximize profile and/or selectivity control. For instance, in embodiments according to the present invention, wherein the etch chemistry includes two members selected from $NH_3$, $NF_3$ and $N_2O$, the mole ratio of the first member to the second member is advantageously in the range of 1:100 to 100:1. In particular embodiments, the ratio of first to second member is in the range of 1:50 to 50:1.

In embodiments according to the present invention wherein the etch chemistry includes all three members selected from $NH_3$, $NF_3$ and $N_2O$, the mole ratio of the first member to the sum of the second and third members is advantageously in the range of 1:200 to 200:1, and the mole ratio of the second member to the third member is in the range of 1:100 to 100:1. In particular embodiments, the mole ratio of first to second and third members is in the range of 1:100 to 100:1, and the mole ratio of second member to third member is 1:50 to 50:1.

A person skilled in the art will recognize that in embodiments according to the present invention, the particular choice of non-$N_2$ member selected from $NH_3$, $NF_3$ and $N_2O$ depends upon the several factors, including the chemical composition of the dielectric to be etched, and the thickness of the dielectric. Thus, in embodiments according to the present invention, the particular non-$N_2$, nitrogen-containing compounds selected from $NH_3$, $NF_3$ and $N_2O$ that are employed in the etch chemistry and, are advantageously optimized to selectively remove dielectric, while retaining optimal profile characteristics.

Figure 1E:
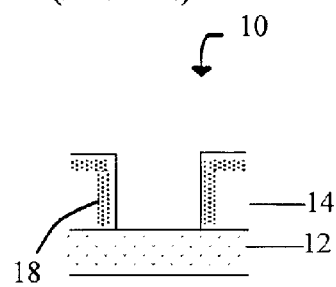
Figure 1F:
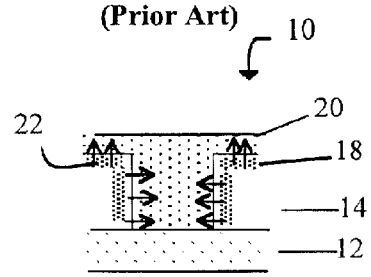
Figure 1G:
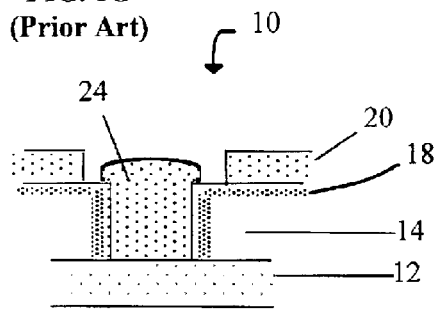
Figure 1H:
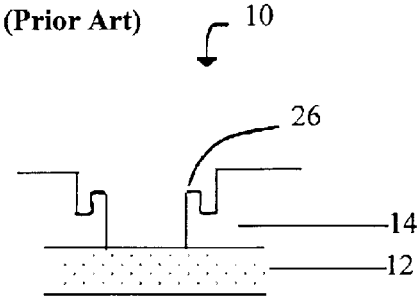
Figure 2E:
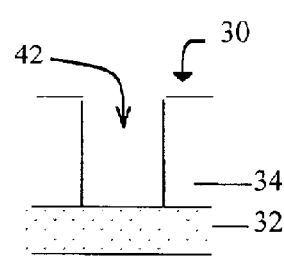

As depicted in FIG. 2E, the first photoresist layer 36 is then removed from article 30. As discussed more fully above, the first photoresist layer 36 is subjected to an ash step to remove substantially all of the first photoresist layer 36. Comparing FIG. 2E with FIG. 1E, it is apparent that the article 10 depicted in FIG. 1E includes a photoresist poison 18, whereas the article 30 according to the present invention depicted in FIG. 2E contains no photoresist poison.

Figure 2F:
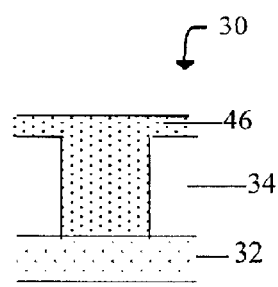

As depicted in FIG. 2F, a second photoresist layer 46 is then applied to the article 30. The second photoresist may be a suitable photoresist, and may be applied in an art-recognized manner, such as by a spin-on technique.

Figure 2G:
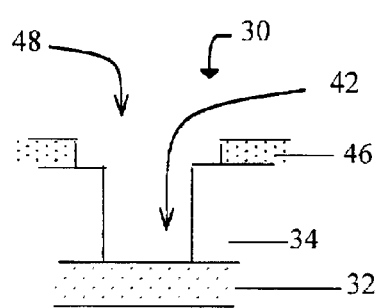

As depicted in FIG. 2G, the second photoresist layer 46 is then selectively exposed and developed to form a trench pattern aperture 48. As can be seen in FIG. 2G, the trench pattern aperture 48 and via 42 are substantially free of poisoned photoresist.

Figure 2H:
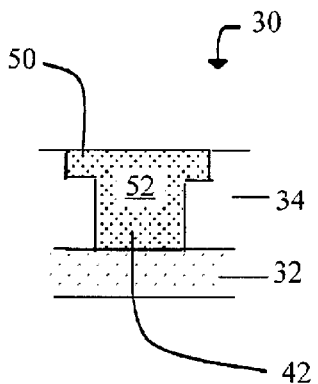

As depicted in FIG. 2H, the dielectric layer 34 is then etched to form a trench 50. The trench 50 is formed by etching the dielectric layer 34 using the second photoresist 46 as an etch mask. Then the second photoresist 46 is removed, advantageously by an ash method, and the trench 50 and via 42 are filled with conductive material 52, such as copper or a copper alloy. The conductive material 52 is etched back to conform to the surface of the dielectric layer 34, for instance by chemical mechanical polishing (CMP) to form the device 30 depicted in FIG. 2H.

The process according to the present invention allows for etching of a substrate, such as a dielectric comprising $SiO_2$, with excellent profile and/or selectivity control, while avoiding the deposition of $N_2$ in the substrate. The process according to the present invention thus substantially avoids the problem of incomplete removal of exposed photoresist due to photoresist poisoning, especially that poisoning attributable to substrate etching in the presence of $N_2$. The process according to the present invention thereby allows one to carry out multiple photoresist mask and etch steps with the assurance that second and later applied photoresist layers will not be poisoned by $N_2$ left behind by earlier etch steps. The process according to the present invention thereby provides for more complex, and more accurate, photolithographic methodologies employing etch steps followed by further photolithographic processing.

While this invention has been described in connection with what are presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. A method of forming an interconnect structure having a first feature and a second feature, comprising the steps of:
   (a) providing an article comprising a conductive layer that has a dielectric layer thereon;
   (b) depositing a first photoresist layer on the dielectric layer;
   (c) patterning the first photoresist layer to form a first mask pattern defining the first feature;
   (d) etching the dielectric layer using the first photoresist layer as a mask to form the first feature using an etch chemistry that comprises a member of the group $NH_3$, $NF_3$ and $N_2O$;
   (e) removing the first photoresist;
   (f) depositing a second photoresist layer on the article;
   (g) patterning the second photoresist layer to form a second mask pattern defining the second feature;
   (h) etching the dielectric layer using the second photoresist layer as a mask to form the second feature.

2. A method according to claim 1, further comprising depositing copper or a copper alloy in the first and second feature.

3. A method according to claim 2, wherein the dielectric layer comprises $SiO_2$ or a low K dielectric.

4. A method according to claim 1, wherein the wherein the etch chemistry comprises $NH_3$.

5. A method according to claim 1, wherein the wherein the etch chemistry comprises $NF_3$.

6. A method according to claim 1, wherein the etch chemistry comprises $N_2O$.

7. A method according to claim 1, wherein the etch chemistry further comprises an inert gas.

8. A method according to claim 7, wherein the inert gas is selected from the group consisting of He, Ne and Ar.

9. A method according to claim 1, wherein the etchant comprises one or more of a hydrofluorocarbon, a fluorocarbon, a hydrochlorocarbon, or a chlorofluorocarbon.

10. A dual damascene method of forming an interconnect structure having a via and a trench, comprising the steps of:
    (a) providing a semiconductor wafer comprising a conductive layer that has a dielectric layer thereon;
    (b) depositing a first photoresist layer on the dielectric layer;
    (c) patterning the first photoresist layer to form a first mask pattern defining the via;
    (d) etching the dielectric layer using the first photoresist layer as a mask to form the via using an etch chemistry that comprises a member of the group $NH_3$, $NF_3$ and $N_2O$;
    (e) removing the first photoresist;
    (f) depositing a second photoresist layer on the article;
    (g) patterning the second photoresist layer to form a second mask pattern defining trench;
    (h) etching the dielectric layer using the second photoresist layer as a mask to form the trench;
    (i) depositing copper or a copper alloy in the trench and via; and
    (j) etching the copper or copper alloy back to the surface of the dielectric layer.

* * * * *